US010534870B2

(12) United States Patent
Loss

(10) Patent No.: US 10,534,870 B2
(45) Date of Patent: *Jan. 14, 2020

(54) METHODS, APPARATUSES AND COMPUTER PROGRAM PRODUCTS FOR AUTOMATIC, NON-PARAMETRIC, NON-ITERATIVE THREE DIMENSIONAL GEOGRAPHIC MODELING

(71) Applicant: HERE GLOBAL B.V., Eindhoven (NL)

(72) Inventor: Leandro Augusto Loss, Newark, CA (US)

(73) Assignee: HERE GLOBAL B.V., Eindhoven (NL)

(*) Notice: Subject to any disclaimer, the term of this patent is extended or adjusted under 35 U.S.C. 154(b) by 473 days.

This patent is subject to a terminal disclaimer.

(21) Appl. No.: 15/398,974

(22) Filed: Jan. 5, 2017

(65) Prior Publication Data
US 2017/0116353 A1 Apr. 27, 2017

Related U.S. Application Data

(63) Continuation of application No. 14/028,069, filed on Sep. 16, 2013, now Pat. No. 9,600,607.

(51) Int. Cl.
*G06F 17/50* (2006.01)
*G06F 16/29* (2019.01)
(Continued)

(52) U.S. Cl.
CPC .......... *G06F 17/5004* (2013.01); *G06F 16/29* (2019.01); *G06K 9/00637* (2013.01);
(Continued)

(58) Field of Classification Search
CPC ..... G06F 17/5004; G06F 16/29; G06T 17/05; G06T 9/40; G06T 9/001; H04W 4/023;
(Continued)

(56) References Cited

U.S. PATENT DOCUMENTS 9,600,607 B2 3/2017 Loss
2006/0061566 A1 3/2006 Verma et al.
(Continued)

FOREIGN PATENT DOCUMENTS

GB        2457215 A     8/2009
WO    WO 2012/139249 A1   10/2012

OTHER PUBLICATIONS

European Patent Office, Communication pursuant to Article 94(3) EPC for Application No. 14184341.7, dated Oct. 31, 2018, 9 pages, Germany.

(Continued)

*Primary Examiner* — Eunhee Kim
(74) *Attorney, Agent, or Firm* — Alston & Bird LLP

(57) ABSTRACT

An apparatus for generating 3D geographical models includes a processor and memory storing executable computer program code causing the apparatus to at least perform operations including removing 3D points of a cloud depicting vertical structures in a geographic area responsive to analyzing a set of 3D points of the cloud. The points include data indicating geocoordinates of the geographic area. The computer program code further causes the apparatus to segment rooftops of vertical structures responsive to analyzing the set. The computer program code further causes the apparatus to delineate points of segmented rooftops responsive to extracting a boundary and a portion of rooftops. The computer program code further causes the apparatus to generate 3D geographic models depicting the geographic area based on connecting delineating points to a base including a height lower than heights of delineating points. Corresponding methods and computer program products are also provided.

20 Claims, 14 Drawing Sheets

(51) Int. Cl.
  *G06T 9/40*     (2006.01)
  *G06T 17/05*    (2011.01)
  *H04W 4/02*     (2018.01)
  *H04W 4/18*     (2009.01)
  *G06K 9/00*     (2006.01)
  *G06K 9/46*     (2006.01)
  *G06T 9/00*     (2006.01)

(52) U.S. Cl.
  CPC ............ *G06K 9/4604* (2013.01); *G06T 9/001* (2013.01); *G06T 9/40* (2013.01); *G06T 17/05* (2013.01); *H04W 4/023* (2013.01); *H04W 4/185* (2013.01)

(58) Field of Classification Search
  CPC .. H04W 4/185; G06K 9/4604; G06K 9/00637
  USPC ...................................... 703/1; 345/419–420
  See application file for complete search history.

(56) References Cited

U.S. PATENT DOCUMENTS

| | | |
|---|---|---|
| 2012/0321129 A1 | 12/2012 | McLaughlin et al. |
| 2013/0202197 A1 | 8/2013 | Reeler et al. |
| 2014/0198978 A1 | 7/2014 | Chen |
| 2015/0213572 A1 | 7/2015 | Loss |

OTHER PUBLICATIONS

Sampath, A., et al., "Segmentation and Reconstruction of Polyhedral Building Roofs From Aerial Lidar Point Clouds", IEEE Transactions on Geoscience and Remote Sensing, Mar. 2010, vol. 48, No. 3, pp. 1554-1567, IEEE, U.S.A.

Toshev, Alexander, et al., "Detecting and Parsing Architecture at City Scale from Range Data", IEEE Conference on Computer Vision and Pattern Recognition, Jun. 13-18, 2010, pp. 398-405, IEEE, San Francisco, CA.

Brenner, C., et al., "Rapid Acquisition of Virtual Reality City Models From Multiple Data Sources," In the Proceedings of ISPRS Commission V Symposium, Real-Time Imaging and Dynamic Analysis, Jun. 2-5, 1998, pp. 323-330, vol. 32, Part 5, Japan.

Cheng, Liang, et al., "Dynamic Triangle—Based Method for 3D Building Rooftop Reconstruction From LiDAR Data", In the Proceedings of the 19th International Conference on Geoinformatics, Jun. 24, 2011, pp. 1-4, IEEE, USA.

Dorninger, P., et al., "A Comprehensive Automated 3D Approach for Building Extraction, Reconstruction, and Regularization From Airborne Laser Scanning Point Clouds," Sensors, 2008, pp. 7323-7343, vol. 8, MDPI, Switzerland.

Eichenlaub, Ronald, et al., "Fidelity at High Speed: Wireless Insite® Real Time Module™", Military Communications Conference, Nov. 16, 2008, pp. 1-7, IEEE, USA.

European Patent Office, Extended European Search Report for Application No. 14184341.7, dated Feb. 4, 2015, 12 pages, Germany.

Frueh, C., et al., "Constructing 3D City Models by Merging Ground-Based and Airborne Views", In the Proceedings of IEEE Computer Society Conference on Computer Vision and Pattern Recognition, Jun. 18-20, 2003, pp. 562-569, vol. 2, IEEE, USA.

Gurram, P., et al., "3D Scene Reconstruction Through a Fusion of Passive Video and Lidar Imagery," In the Proceedings of the 36th Applied Imagery Pattern Recognition Workshop (AIPR), Oct. 10-12, 2007, pp. 133-138, IEEE Computer Society, USA.

Hung, Hsiao-Chu, et al., "Building Boundary Extraction from Lidar Data", The 33rd Asian Conference on Remote Sensing, Nov. 26-30, 2012, 8 pages, Pattaya, Thailand.

Kada, M., "The 3D Berlin Project," In the Proceedings of Photogrammetric Week '09, Sep. 7-11, 2009, pp. 331-340. Fritsch, D. (Ed.), Wichmann-Verlag, Germany.

Khoshelham, Kourosh, et al., "A Split-and-Merge Technique for Automated Reconstruction of Roof Planes", Photogrammetric Engineering & Remote Sensing, Jul. 2005, pp. 855-862, vol. 71, No. 7, ASPRS—The Imaging & Geospatial Information Society, USA.

Leininger, Brian, et al., "UrbanScape", Defense and Security Symposium, International Society for Optics and Photonics, Apr. 10-12, 2007, 11 pages, Orlando, Florida.

Ma, R., "Building Model Reconstruction From Lidar Data and Aerial Photograph, Dissertation, The Ohio State University," 2004, 166 pages, ProQuest Information and Learning Company, USA.

Milde, J., et al., "Building Reconstruction Using a Structural Description Based on a Formal Grammar," 2008, pp. 227-232, The International Archives of the Photogrammetry, Remote Sensing and Spatial Information Sciences, vol. 37, Part B3b, China.

Milde, J., et al., "Graph-Based Modeling of Building Rooftops," In the Proceedings of the 12th AGILE Conference on GIScience, Jun. 2-5, 2009, 5 pages, Germany.

Nex F., et al., "Automatic Roof Outlines Reconstruction From Photogrammetric DSM", *ISPRS Annals of the Photogrammetry, Remote Sensing and Spatial Information Sciences*, vol. 1-3, 2012, pp. 257-262, Retrieved from <http://www.isprs-ann-photogramm-remote-sens-spatial-inf-sci.net/I-3/257/2012/isprsannals-I-3-257-2012.pdf> on May 4, 2015.

Novacheva, A., "Building Roof Reconstruction From Lidar Data and Aerial Images Through Plane Extraction and Colour Edge Detection," 2008, pp. 53-57, The International Archives of the Photogrammetry, Remote Sensing and Spatial Information Sciences, vol. 37, Part B6b, China.

Owen, Steven J., "A Survey of Unstructured Mesh Generation Technology", IMR, 1998, pp. 239-267, U.S.A.

Park, J., et al., "Automatic Extraction of Large Complex Buildings Using Lidar Data and Digital Maps," In the Proceedings of ISPRS Commission III Photogrammetric Computer Vision PCV '06, Sep. 20-22, 2006, pp. 148-154, vol. 36, Part 3, Germany.

Sohn, G., et al., "Using a Binary Space Partitioning Tree for Reconstructing Polyhedral Building Models From Airborne Lidar Data," Photogrammetric Engineering & Remote Sensing, Nov. 2008, pp. 1425-1438, vol. 7, No. 11, American Society for Photogrammetry and Remote Sensing, USA.

Sun, Shaohui, et al., "Aerial 3D Building Detection and Modeling From Airborne LiDAR Point Clouds", IEEE Journal of Selected Topics in Applied Earth Observations and Remote Sensing, Jun. 2013, pp. 1440-1449, vol. 6, No. 3, IEEE, USA.

Taillandier, F., "Automatic Building Reconstruction From Cadastral Maps and Aerial Images," The International Archives of the Photogrammetry, Remote Sensing and Spatial Information Sciences, Aug. 29-30, 2005, pp. 105-110, vol. 36, Part 3/W24, Austria.

Triebel, Rudolph, et al., "Robust 3D Scan Point Classification using Associative Markov Networks", Proceeding of the 2006 IEEE International Conference on Robotics and Automation, May 2006, pp. 2603-2608, IEEE, USA.

U.S. Appl. No. 14/163,614, Unpublished (filing date Jan. 24, 2014) (Leandro Augusto Loss, Inventor).

United States Patent and Trademark Office, Notice of Allowance for U.S. Appl. No. 14/028,069, dated Nov. 17, 2016.

United States Patent and Trademark Office, Office Action for U.S. Appl. No. 14/028,069, dated Jan. 12, 2016.

United States Patent and Trademark Office, Office Action for U.S. Appl. No. 14/028,069, dated Jul. 28, 2016.

Verma, V., et al., "3D Building Detection and Modeling From Aerial Lidar Data," In the Proceedings of the 2006 IEEE Computer Society Conference on Computer Vision and Pattern Recognition, CVPR'06, Jun. 17-22, 2006, pp. 2213-2220, IEEE, USA.

Wang, Shugen, et al., "Simple Building Reconstruction from Lidar Data and Aerial Imagery", $2^{nd}$ International Conference on Remote Sensing, Environment and Transportation Engineering, Jun. 2012, 5 pages, IEEE, USA.

You, Suya, et al., "Urban Site Modeling from LiDAR", *Lecture Notes in Computer Science*, 2003, pp. 579-588, vol. 2669, Springer-Verlag, Germany.

U.S. Appl. No. 14/028,069, filed Sep. 16, 2013, U.S. Pat. No. 9,600,607, Patented.

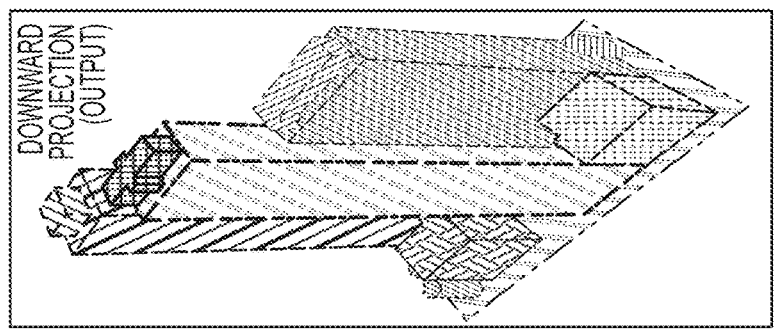
FIG. 4G
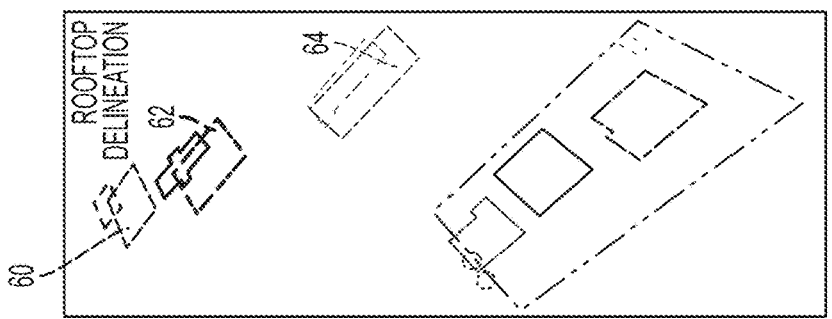
FIG. 4F
FIG. 4D
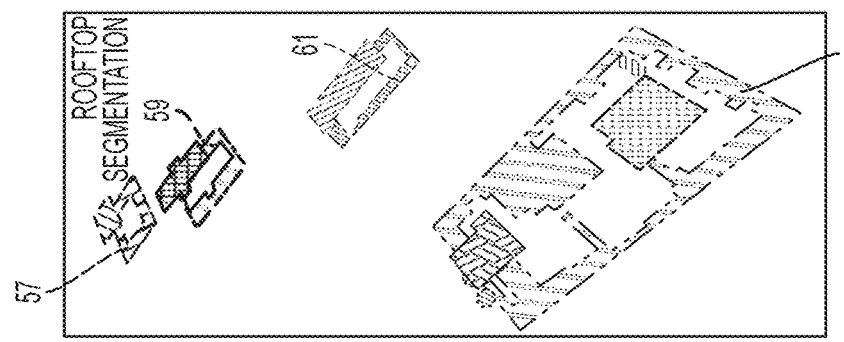
FIG. 4B
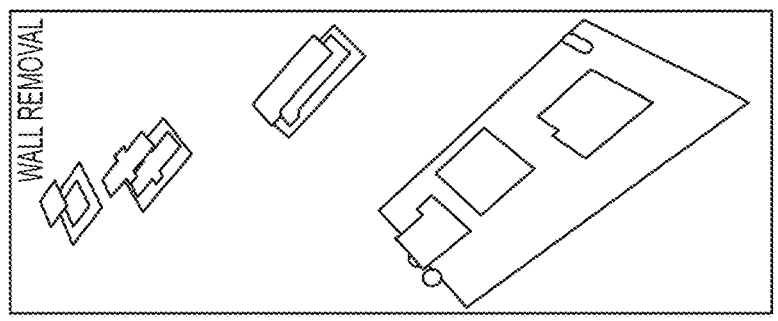
FIG. 4A
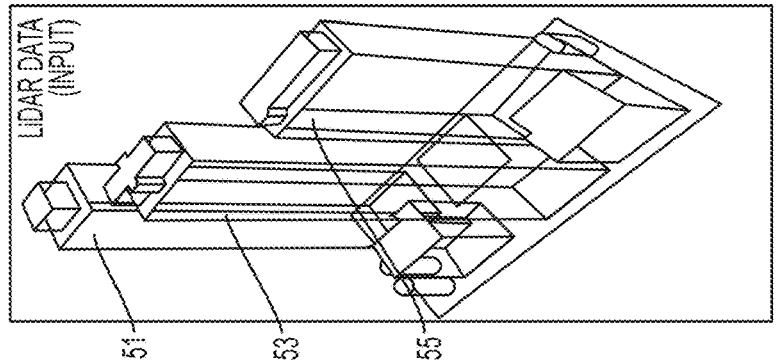

METHODS, APPARATUSES AND COMPUTER PROGRAM PRODUCTS FOR AUTOMATIC, NON-PARAMETRIC, NON-ITERATIVE THREE DIMENSIONAL GEOGRAPHIC MODELING

CROSS-REFERENCE TO RELATED APPLICATIONS

This application is a continuation of U.S. Pat. No. 9,600,607, filed Sep. 16, 2013, the contents of which are incorporated herein in their entirety by reference.

TECHNOLOGICAL FIELD

An embodiment of the invention relates generally to three dimensional location services and, more particularly, relates to a method, apparatus, and computer program product for modeling of three dimensional geographical areas.

BACKGROUND

The modern communications era has brought about a tremendous expansion of wireline and wireless networks. Computer networks, television networks, and telephony networks are experiencing an unprecedented technological expansion, fueled by consumer demand. Wireless and mobile networking technologies have addressed related consumer demands, while providing more flexibility and immediacy of information transfer.

Current and future networking technologies continue to facilitate ease of information transfer and convenience to users. Due to the now ubiquitous nature of electronic communication devices, people of all ages and education levels are utilizing electronic devices to communicate with other individuals or contacts, receive services and/or share information, media and other content. One area in which there is a demand to increase ease of information transfer relates to three dimensional (3D) city modeling.

At present, reconstruction and display of 3D city models are important parts of next generation mapping systems, and 3D location and content services. Due to the number of constructions in an urban scene, automatic methods have been in high demand. Automatic computation of 3D city models has, in general, explored two different sources of data: (i) stereo photogrammetric imagery; and (ii) 3D sensors acquiring a 3D cloud of points. In this regard, the relative recent usage of 3D sensors for city survey (e.g., U.S. Geological Surveys (USGS)) has given the 3D city modeling field a new branch for research. The data collected by such sensors may be composed of a cloud of 3D points that are geo-referenced.

Automation of 3D city modeling may potentially reduce time and effort of specialized personnel. However, the broad academic research in the field indicates that the automatic generation of 3D city models may cause problems associated with extreme computational demand, as described below.

Current solutions to 3D modeling from a cloud of points typically employ parametric approaches utilizing a dictionary of predefined shapes that are optimized to fit on collected 3D data. For instance, shapes to be optimized may vary from low-level details such as lines and planes. At present, existing parametric approaches are limited to sensitive parameter setting and predefined shapes which typically require extreme computational demand. As such, at present, parametric approaches for reconstruction of 3D city models may be difficult to scale across cities with different architecture.

In view of the foregoing drawbacks, it may be desirable to provide an efficient and optimal mechanism for generating three dimensional geographical models.

BRIEF SUMMARY

A method, apparatus and computer program product are therefore provided for generating three dimensional models for geographic areas. In this regard, an example embodiment may utilize a 3D cloud of points as input for reconstructing models for 3D geographic areas (e.g., urban areas (e.g., cities) in a non-parametric and non-iterative manner.

As such, an example embodiment may provide a technique for reconstructing 3D geographical models (e.g., urban models) that inquires about the proximity and nature of neighboring 3D points. For instance, in one example embodiment, a local vicinity may be rapidly assessed through the encoding of the 3D points in a k-dimensional (kd)-tree (e.g., a parenthood tree). By inquiring about the proximity and nature of neighboring 3D points an example embodiment may generate detailed results reconstructing 3D geographical (e.g., urban) areas in an extremely computationally efficient manner. As a result, an exemplary embodiment may generate fast 3D geographical (e.g., urban) models with high detail and quality accuracy which may minimize errors.

In one example embodiment, a method is provided for generating 3D geographical models. The method may include removing one or more three dimensional points of a cloud depicting vertical structures detected in a geographic area in response to analyzing a set of three dimensional points of the cloud corresponding to the geographic area in which each of the points include data indicating geocoordinates of the geographic area. The method may further include segmenting rooftops of the vertical structures detected in the geographic area, in response to the analyzing of the set, by separating each of the rooftops from another respective rooftop. The method may further include delineating the points of the segmented rooftops in response to extracting an outer boundary and at least a subset of an inner portion of the segmented rooftops. The method may further include generating one or more three dimensional geographic models depicting the geographic area in three dimensions based in part on connecting each of the delineating points of the segmented rooftops to a corresponding base including a height that is lower than respective heights of the delineating points.

In another example embodiment, an apparatus is provided for generating 3D geographical models. The apparatus may include a processor and a memory including computer program code. The memory and computer program code are configured to, with the processor, cause the apparatus to at least perform operations including removing one or more three dimensional points of a cloud depicting vertical structures detected in a geographic area in response to analyzing a set of three dimensional points of the cloud corresponding to the geographic area in which each of the points include data geocoordinates of the geographic area. The memory and computer program code are further configured to, with the processor, cause the apparatus to segment rooftops of the vertical structures detected in the geographic area, in response to the analyzing of the set, by separating each of the rooftops from another respective rooftop. The memory and computer program code are further configured to, with the processor, cause the apparatus to delineate the points of the segmented rooftops in response to extracting an outer boundary and at least a subset of an inner portion of the segmented rooftops. The memory and computer program code are further configured to, with the processor, cause the apparatus to generate one or more three dimensional geographic models depicting the geographic area in three dimensions based in part on connecting each of the delineating points of the segmented rooftops to a corresponding base including a height that is lower than respective heights of the delineating points.

In yet another example embodiment, a computer program product is provided for generating 3D geographical models. The computer program product includes at least one computer-readable storage medium having computer-readable program code portions stored therein. The computer-executable program code instructions may include program code instructions configured to remove one or more three dimensional points of a cloud depicting vertical structures detected in a geographic area in response to analyzing a set of three dimensional points of the cloud corresponding to the geographic area in which each of the points include data indicating geocoordinates of the geographic area. The program code instructions may also segment rooftops of the vertical structures detected in the geographic area, in response to the analyzing of the set, by separating each of the rooftops from another respective rooftop. The program code instructions may also delineate the points of the segmented rooftops in response to extracting an outer boundary and at least a subset of an inner portion of the segmented rooftops. The program code instructions may also generate one or more three dimensional geographic models depicting the geographic area in three dimensions based in part on connecting each of the delineating points of the segmented rooftops to a corresponding base including a height that is lower than respective heights of the delineating points.

BRIEF DESCRIPTION OF THE SEVERAL VIEWS OF THE DRAWINGS

Figure 1:
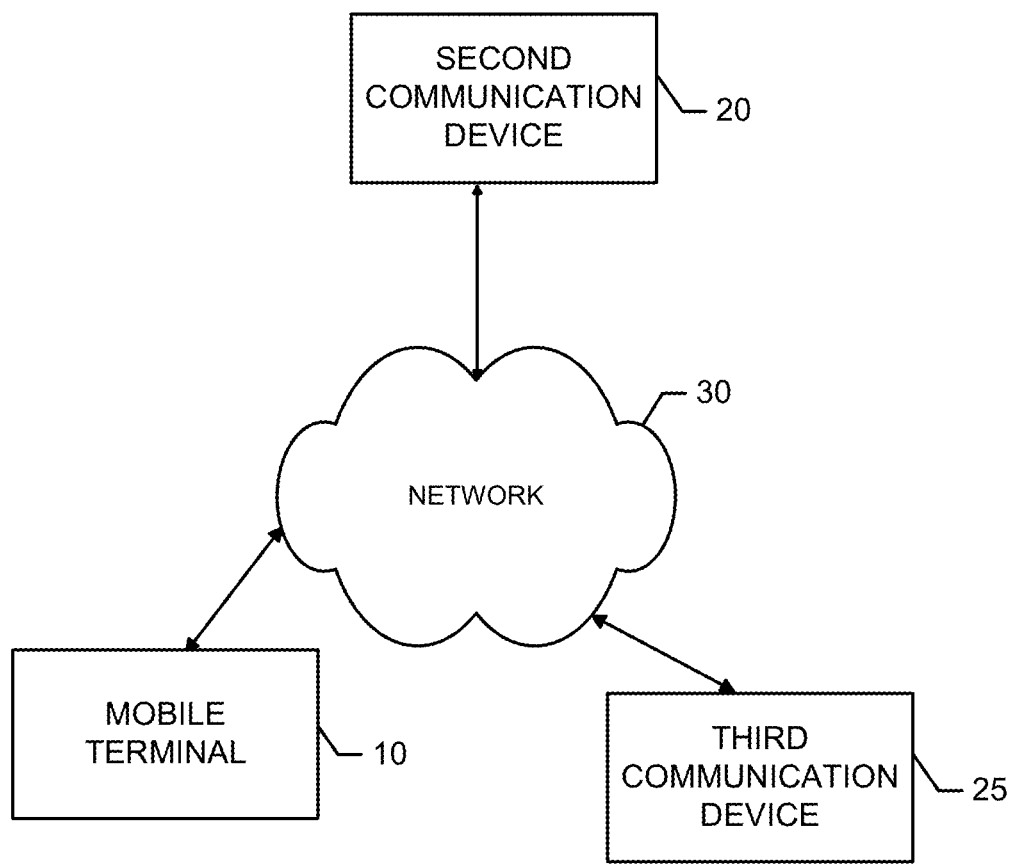
Figure 2:
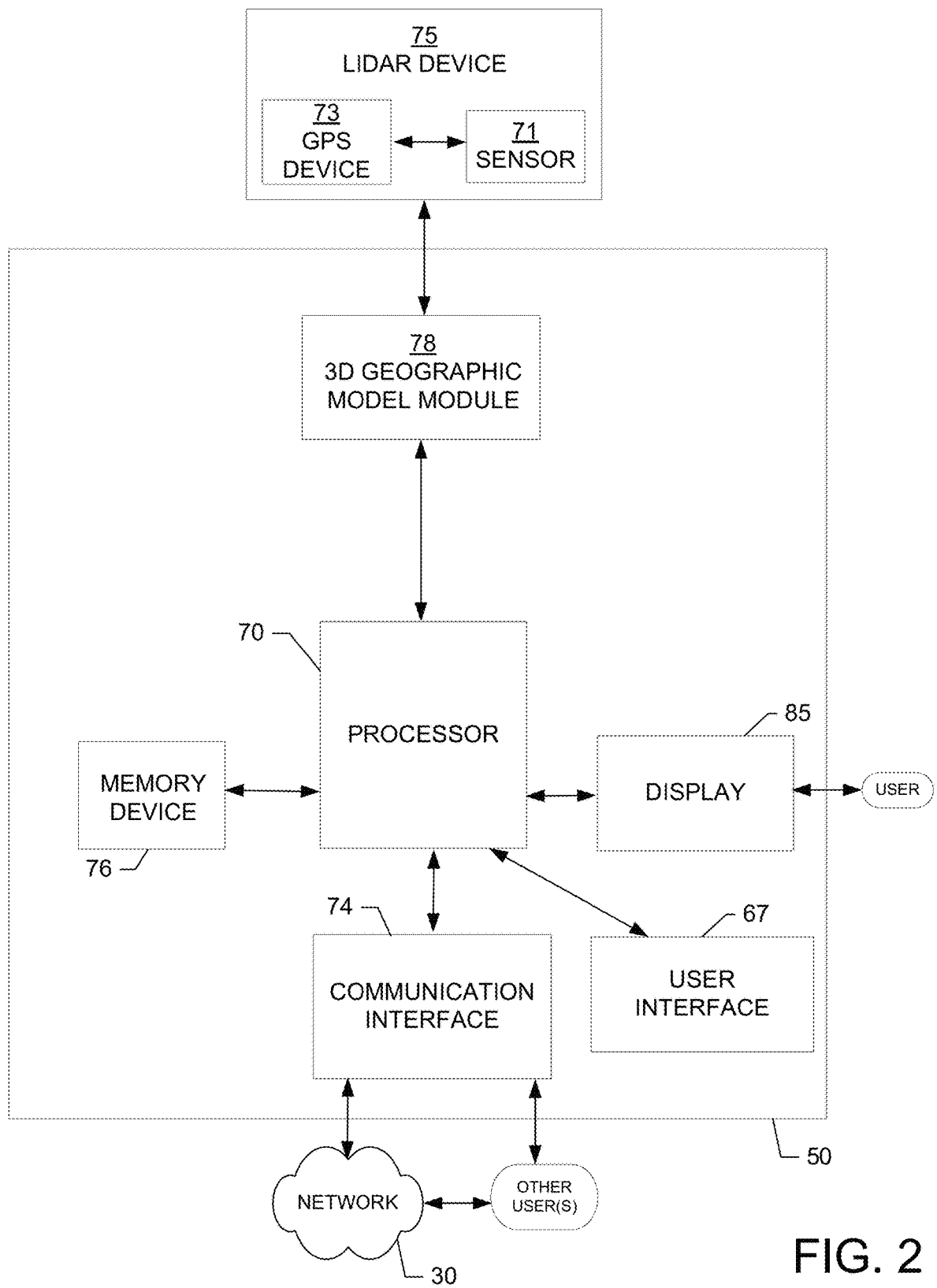
Figure 3:
Figure 4C:
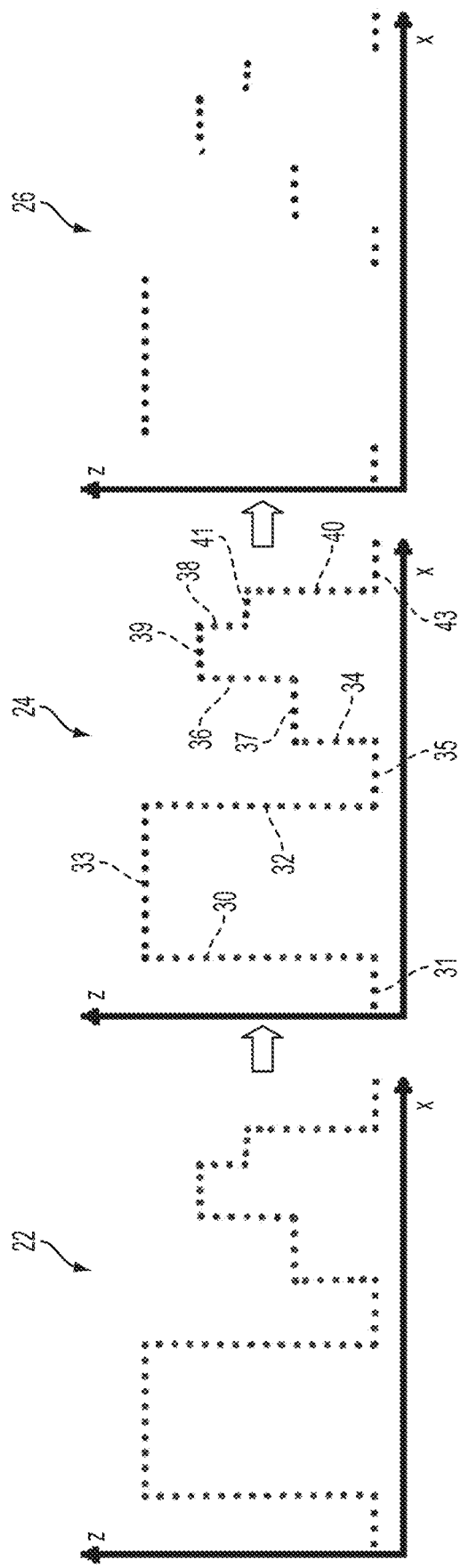
Figure 4E:
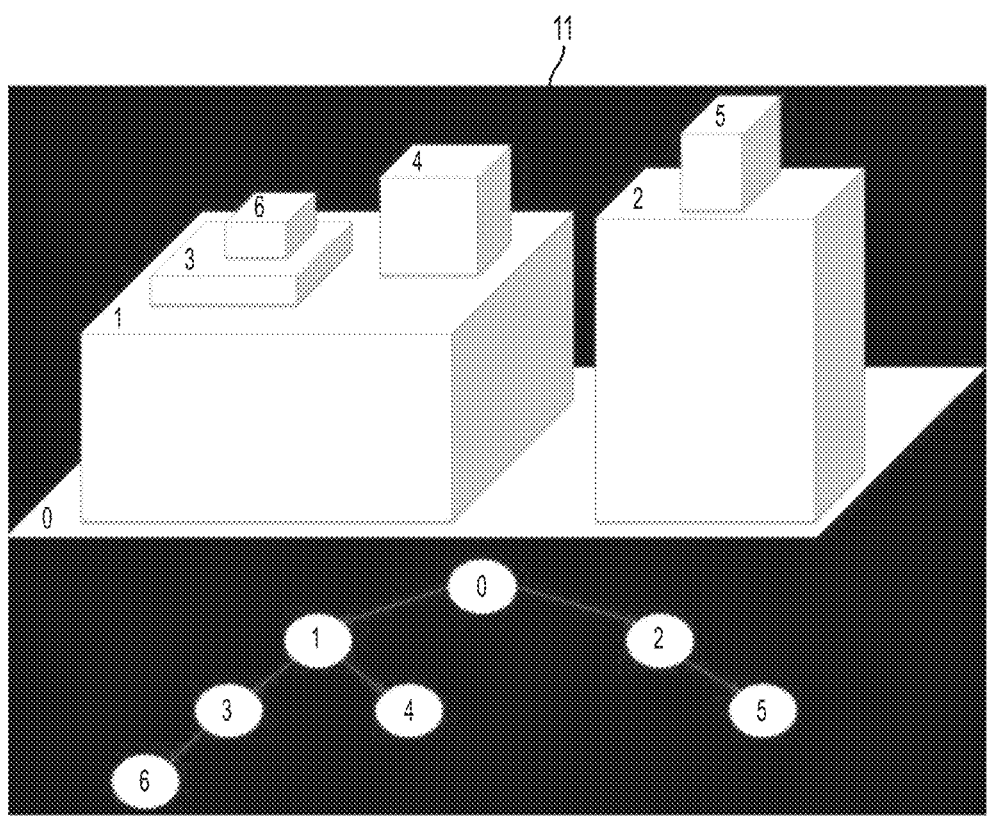
Figure 5:
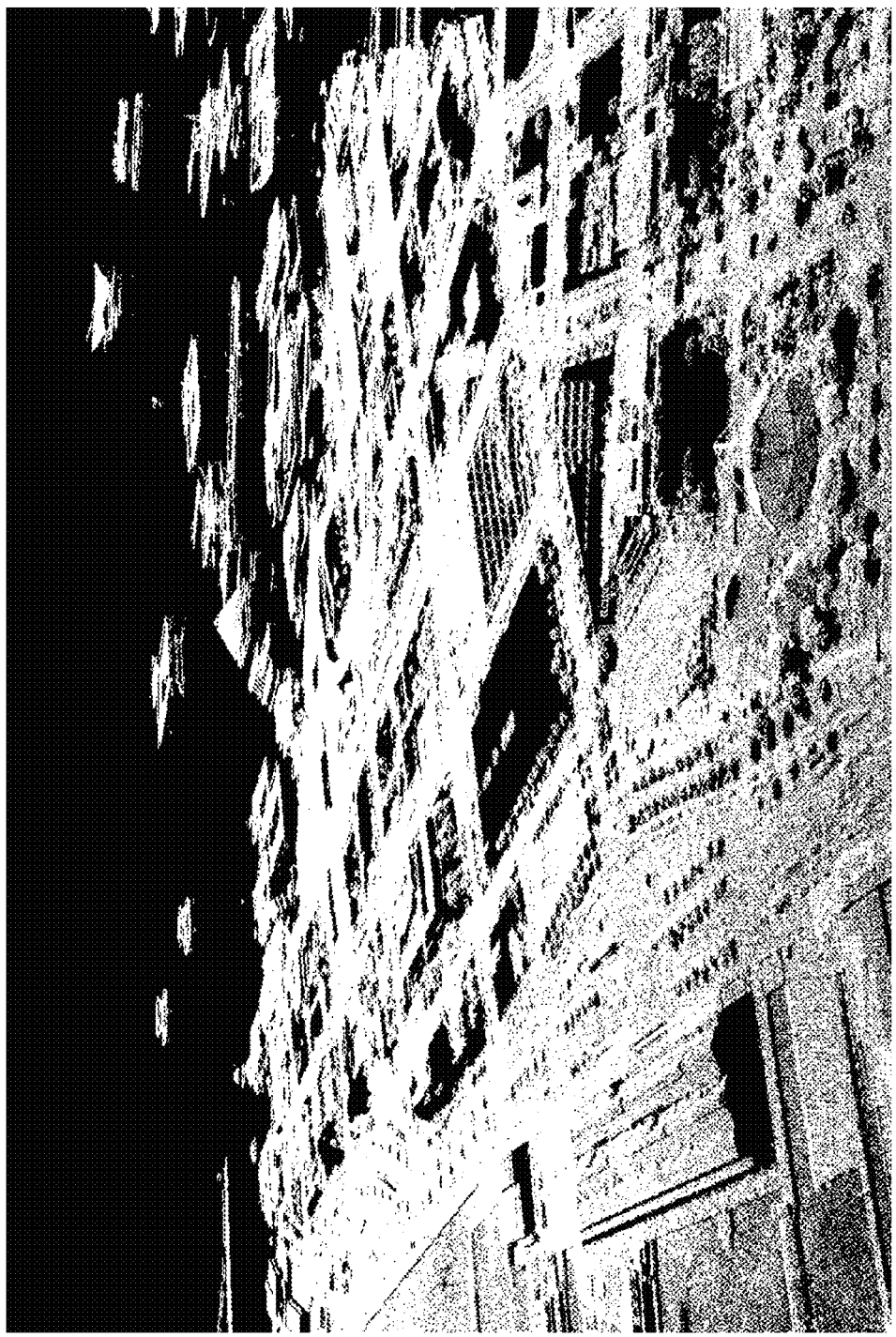
Figure 6:
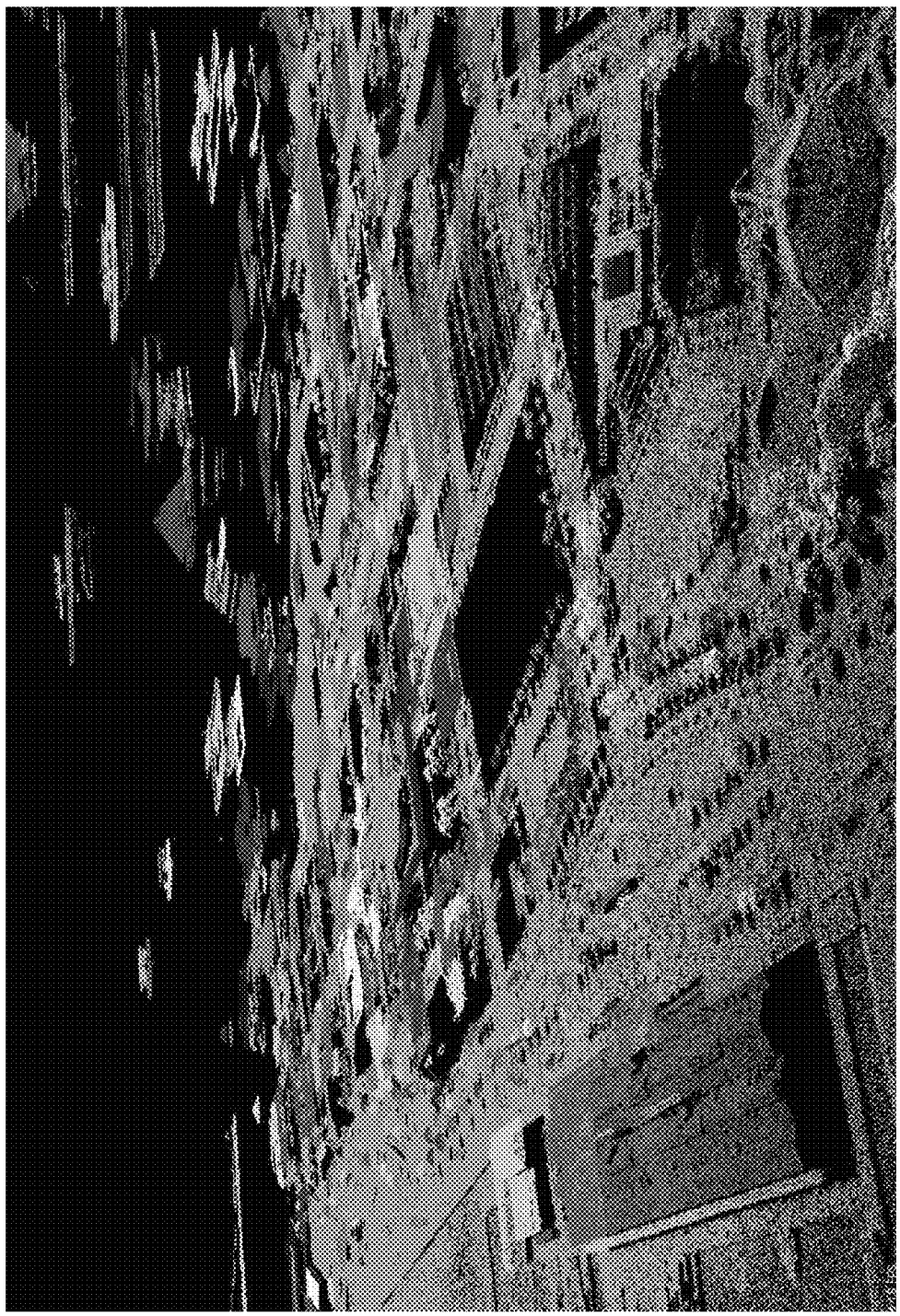
Figure 7:
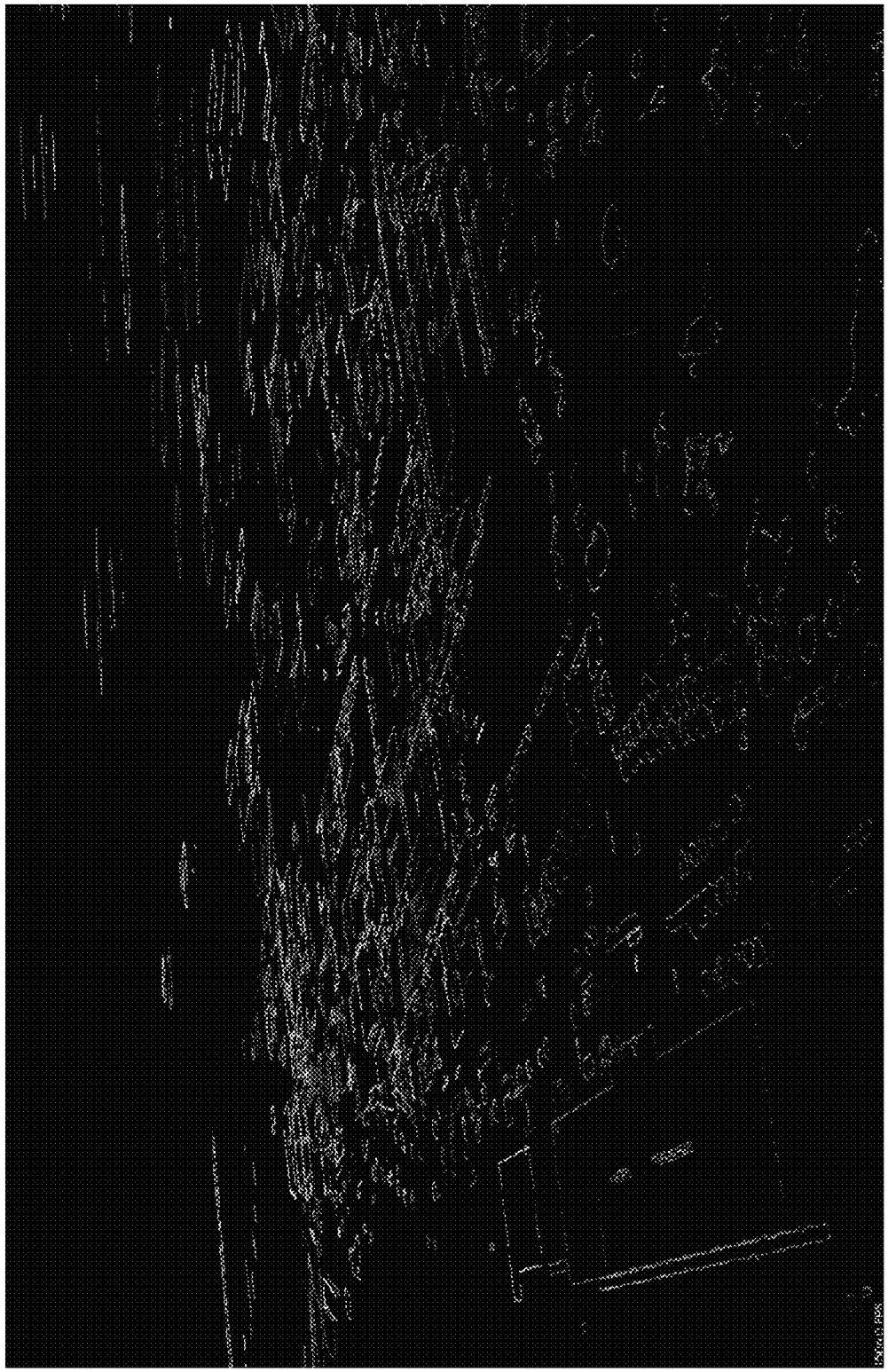
Figure 8:
Figure 9:
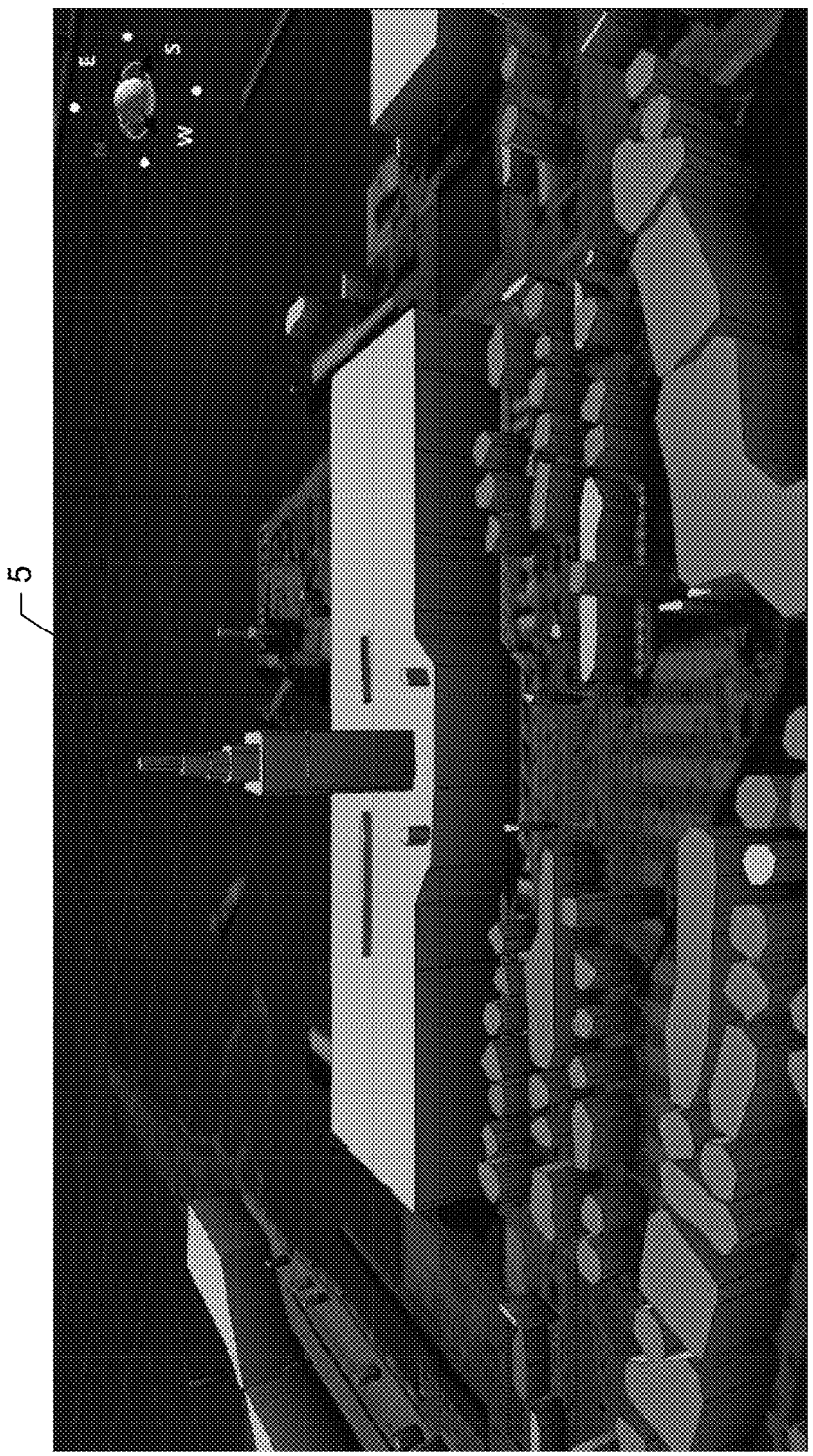
Figure 10:
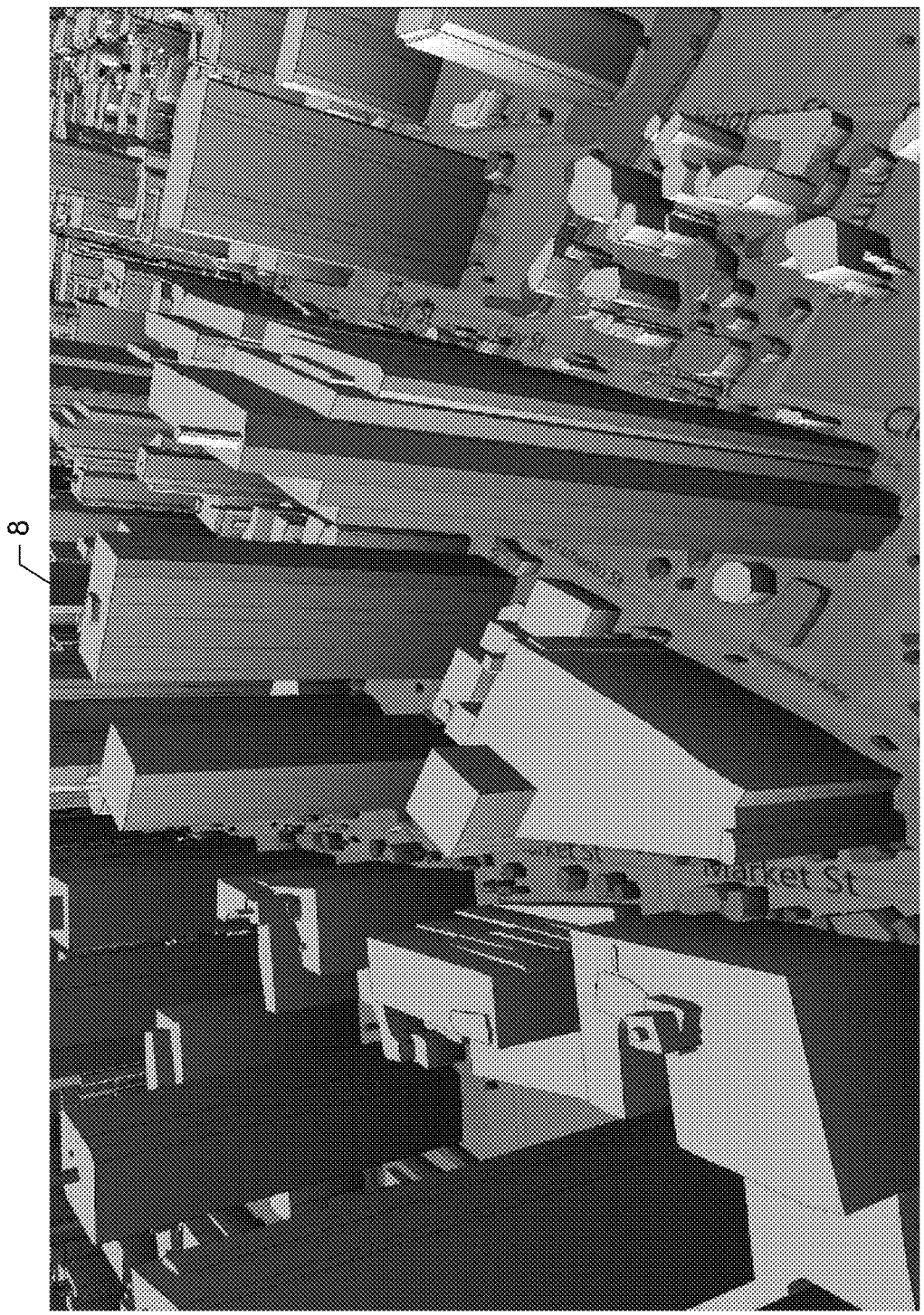
Figure 11:
Figure 12:
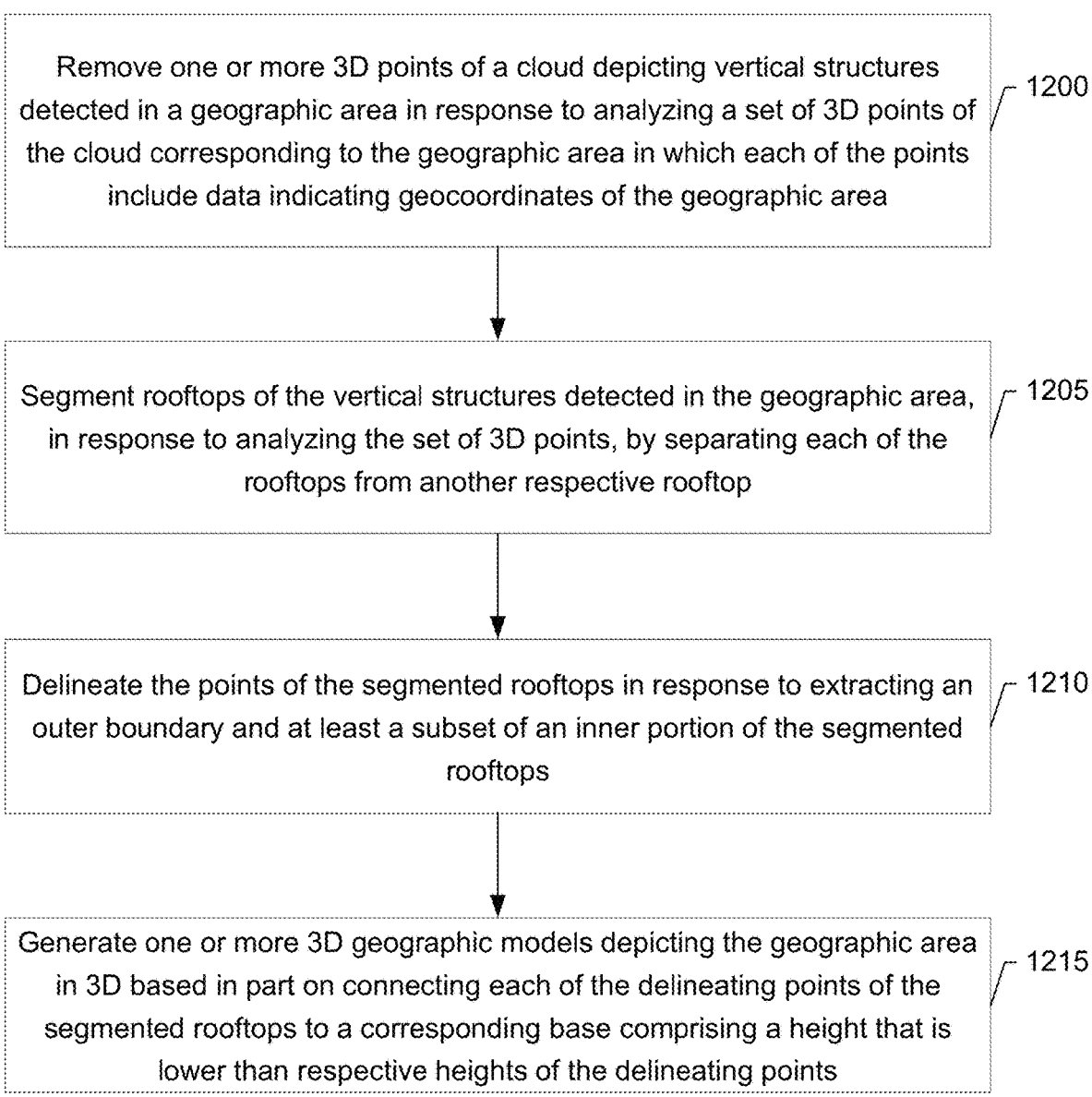

Having thus described some embodiments of the invention in general terms, reference will now be made to the accompanying drawings, which are not necessarily drawn to scale, and wherein:

FIG. 1 is a schematic block diagram of a system according to an example embodiment of the invention;

FIG. 2 is a schematic block diagram of an apparatus according to an example embodiment of the invention;

FIG. 3 is a diagram illustrating a Light Detection and Ranging (LIDAR) cloud of points;

FIG. 4A is a diagram illustrating input of LIDAR data according to an example embodiment of the invention;

FIG. 4B is a diagram illustrating wall removal according to an example embodiment of the invention;

FIG. 4C is a diagram illustrating two dimensional wall removal according to an example embodiment of the invention;

FIG. 4D is a diagram illustrating rooftop segmentation according to an example embodiment;

FIG. 4E is a diagram illustrating a parenthood tree according to an example embodiment of the invention;

FIG. 4F is a diagram illustrating rooftop delineation according to an example embodiment of the invention;

FIG. 4G is a diagram illustrating output of downward projection according to an example embodiment of the invention;

FIG. 5 is a diagram illustrating results of wall removal according to an example embodiment of the invention;

FIG. 6 is a diagram illustrating results of rooftop segmentation according to an example embodiment of the invention;

FIG. 7 is a diagram illustrating results of rooftop delineation according to an example embodiment of the invention;

FIG. 8 is a diagram illustrating results encoded and provided in a map according to an example embodiment of the invention;

FIG. 9 is a diagram illustrating a closer view on models highlighting architectural details of a pier in a city according to an example embodiment of the invention;

FIG. 10 is a diagram illustrating a closer view on models highlighting the architectural details of a financial district in a city according to an example embodiment of the invention;

FIG. 11 is a diagram illustrating a view of a modeled area of a city according to an example embodiment of the invention; and FIG. 12 illustrates a flowchart for generating 3D geographic models according to an example embodiment of the invention.

DETAILED DESCRIPTION

Some embodiments of the present invention will now be described more fully hereinafter with reference to the accompanying drawings, in which some, but not all embodiments of the invention are shown. Indeed, various embodiments of the invention may be embodied in many different forms and should not be construed as limited to the embodiments set forth herein. Like reference numerals refer to like elements throughout. As used herein, the terms "data," "content," "information" and similar terms may be used interchangeably to refer to data capable of being transmitted, received and/or stored in accordance with embodiments of the present invention. Moreover, the term "exemplary", as used herein, is not provided to convey any qualitative assessment, but instead merely to convey an illustration of an example. Thus, use of any such terms should not be taken to limit the spirit and scope of embodiments of the invention.

Additionally, as used herein, the term 'circuitry' refers to (a) hardware-only circuit implementations (e.g., implementations in analog circuitry and/or digital circuitry); (b) combinations of circuits and computer program product(s) comprising software and/or firmware instructions stored on one or more computer readable memories that work together to cause an apparatus to perform one or more functions described herein; and (c) circuits, such as, for example, a microprocessor(s) or a portion of a microprocessor(s), that require software or firmware for operation even if the software or firmware is not physically present. This definition of 'circuitry' applies to all uses of this term herein, including in any claims. As a further example, as used herein, the term 'circuitry' also includes an implementation comprising one or more processors and/or portion(s) thereof and accompanying software and/or firmware. As another example, the term 'circuitry' as used herein also includes, for example, a baseband integrated circuit or applications processor integrated circuit for a mobile phone or a similar integrated circuit in a server, a cellular network device, other network device, and/or other computing device.

As defined herein a "computer-readable storage medium," which refers to a non-transitory, physical or tangible storage medium (e.g., volatile or non-volatile memory device), may be differentiated from a "computer-readable transmission medium," which refers to an electromagnetic signal.

As used herein, the terms "cloud," "point cloud," and similar terms may be used interchangeably to refer to a set of 3D points (also referred to herein as points) including spatial coordinates (e.g., latitude, longitude and altitude coordinates) corresponding to a geographical area.

FIG. 1 illustrates a generic system diagram in which a device such as a mobile terminal 10 is shown in an exemplary communication environment. As shown in FIG. 1, an embodiment of a system in accordance with an example embodiment of the invention may include a first communication device (e.g., mobile terminal 10) and a second communication device 20 capable of communication with each other via a network 30. In one embodiment of the invention may further include one or more additional communication devices, one of which is depicted in FIG. 1 as a third communication device 25. In one embodiment, not all systems that employ an embodiment of the invention may comprise all the devices illustrated and/or described herein. While an embodiment of the mobile terminal 10 and/or second and third communication devices 20 and 25 may be illustrated and hereinafter described for purposes of example, other types of terminals, such as portable digital assistants (PDAs), pagers, mobile televisions, mobile telephones, gaming devices, laptop computers, cameras, video recorders, audio/video players, radios, global positioning system (GPS) devices, Bluetooth headsets, Universal Serial Bus (USB) devices or any combination of the aforementioned, and other types of voice and text communications systems, can readily employ an embodiment of the invention. Furthermore, devices that are not mobile, such as servers and personal computers may also readily employ an embodiment of the invention.

The network 30 may include a collection of various different nodes (of which the second and third communication devices 20 and 25 may be examples), devices or functions that may be in communication with each other via corresponding wired and/or wireless interfaces. As such, the illustration of FIG. 1 should be understood to be an example of a broad view of certain elements of the system and not an all-inclusive or detailed view of the system or the network 30. Although not necessary, in one embodiment, the network 30 may be capable of supporting communication in accordance with any one or more of a number of First-Generation (1G), Second-Generation (2G), 2.5G, Third-Generation (3G), 3.5G, 3.9G, Fourth-Generation (4G) mobile communication protocols, Long Term Evolution (LTE), and/or the like. In one embodiment, the network 30 may be a point-to-point (P2P) network.

One or more communication terminals such as the mobile terminal 10 and the second and third communication devices 20 and 25 may be in communication with each other via the network 30 and each may include an antenna or antennas for transmitting signals to and for receiving signals from one or more base sites. The base sites could be, for example one or more base stations that are part of one or more cellular or mobile networks or one or more access points that may be coupled to a data network, such as a Local Area Network (LAN), a Metropolitan Area Network (MAN), and/or a Wide Area Network (WAN), such as the Internet. In addition, the mobile terminal 10 and the second and third communication devices 20 and 25 may be in communication with each other via the network 30 and each may receive 3D data from a Light Detection and Ranging (LIDAR) device of an aerial system (e.g., an airplane, a helicopter, a satellite, etc.) capturing aerial LIDAR data. The LIDAR device may illuminate a targeted area on the ground and may analyze the reflected light to generate a cloud of 3D points. In this regard, each point in the point cloud may include three dimensional spatial coordinates (e.g., latitude, longitude, and altitude coordinates) that correspond to a particular point of a geographic area (e.g., a surface of the ground (e.g., Earth's surface), structures (e.g., buildings), trees, etc.) from which a light was reflected. The point clouds may be utilized by the mobile terminal 10, and/or the second and third communication devices 20 and 25 to generate 3D models for one or more maps, as described more fully below.

In addition, other devices such as processing elements (e.g., personal computers, server computers or the like) may be coupled to the mobile terminal 10 and the second and third communication devices 20 and 25 via the network 30. By directly or indirectly connecting the mobile terminal 10 and the second and third communication devices 20 and 25 (and/or other devices) to the network 30, the mobile terminal 10 and the second and third communication devices 20 and 25 may be enabled to communicate with the other devices or each other, for example, according to numerous communication protocols including Hypertext Transfer Protocol (HTTP) and/or the like, to thereby carry out various communication or other functions of the mobile terminal 10 and the second and third communication devices 20 and 25, respectively.

Furthermore, although not shown in FIG. 1, the mobile terminal 10 and the second and third communication devices 20 and 25 may communicate in accordance with, for example, radio frequency (RF), near field communication (NFC), Bluetooth (BT), Infrared (IR) or any of a number of different wireline or wireless communication techniques, including Local Area Network (LAN), Wireless LAN (WLAN), Worldwide Interoperability for Microwave Access (WiMAX), Wireless Fidelity (WiFi), Ultra-Wide Band (UWB), Wibree techniques and/or the like. As such, the mobile terminal 10 and the second and third communication devices 20 and 25 may be enabled to communicate with the network 30 and each other by any of numerous different access mechanisms. For example, mobile access mechanisms such as Wideband Code Division Multiple Access (W-CDMA), CDMA2000, Global System for Mobile communications (GSM), General Packet Radio Service (GPRS) and/or the like may be supported as well as wireless access mechanisms such as WLAN, WiMAX, and/or the like and fixed access mechanisms such as Digital Subscriber Line (DSL), cable modems, Ethernet and/or the like.

In an example embodiment, the first communication device (e.g., the mobile terminal 10) may be a mobile communication device such as, for example, a wireless telephone or other devices such as a personal digital assistant (PDA), mobile computing device, camera, video recorder, audio/video player, positioning device, game device, television device, radio device, or various other like devices or combinations thereof. The second communication device 20 and the third communication device 25 may be mobile or fixed communication devices. However, in one example, the second communication device 20 and the third communication device 25 may be servers, remote computers or terminals such as, for example, personal computers (PCs) or laptop computers.

In an example embodiment, the network 30 may be an ad hoc or distributed network arranged to be a smart space. Thus, devices may enter and/or leave the network 30 and the devices of the network 30 may be capable of adjusting operations based on the entrance and/or exit of other devices to account for the addition or subtraction of respective devices or nodes and their corresponding capabilities.

In an example embodiment, the mobile terminal as well as the second and third communication devices 20 and 25 may employ an apparatus (e.g., apparatus of FIG. 2) capable of employing an embodiment of the invention.

FIG. 2 illustrates a schematic block diagram of an apparatus for generating 3D geographic models according to an example embodiment of the invention. An example embodiment of the invention will now be described with reference to FIG. 2, in which certain elements of an apparatus 50 are displayed. The apparatus 50 of FIG. 2 may be employed, for example, on the mobile terminal 10 (and/or the second communication device 20 or the third communication device 25). Alternatively, the apparatus 50 may be embodied on a network device of the network 30. However, the apparatus 50 may alternatively be embodied at a variety of other devices, both mobile and fixed (such as, for example, any of the devices listed above). In some cases, an embodiment may be employed on a combination of devices. Accordingly, an embodiment of the invention may be embodied wholly at a single device (e.g., the mobile terminal 10), by a plurality of devices in a distributed fashion (e.g., on one or a plurality of devices in a P2P network) or by devices in a client/server relationship. Furthermore, it should be noted that the devices or elements described below may not be mandatory and thus some may be omitted in a certain embodiment.

Referring now to FIG. 2, the apparatus 50 may include or otherwise be in communication with a processor 70, a user interface 67, a communication interface 74, a memory device 76, a display 85, and a 3D geographic model module 78. The memory device 76 may include, for example, volatile and/or non-volatile memory. For example, the memory device 76 may be an electronic storage device (e.g., a computer readable storage medium) comprising gates configured to store data (e.g., bits) that may be retrievable by a machine (e.g., a computing device like processor 70). In an example embodiment, the memory device 76 may be a tangible memory device that is not transitory. The memory device 76 may be configured to store information, data, files, applications, instructions or the like for enabling the apparatus to carry out various functions in accordance with an example embodiment of the invention. For example, the memory device 76 could be configured to buffer input data for processing by the processor 70. Additionally or alternatively, the memory device 76 could be configured to store instructions for execution by the processor 70. As yet another alternative, the memory device 76 may be one of a plurality of databases that store information and/or media content (e.g., pictures, videos, etc.).

The memory device 76 may store a cloud(s) (e.g., a group or set) of 3D points (also referred to herein as a point cloud). Each of the 3D points of a point cloud may include geo-coded information that may be associated with location information corresponding to coordinates such as, for example, latitude, longitude and/or altitude coordinates of real-world objects. The geo-coded information may be evaluated by the processor 70 and/or the 3D geographical model module 78.

The processor 70 may be embodied in a number of different ways. For example, the processor 70 may be embodied as one or more of various processing means such as a coprocessor, microprocessor, a controller, a digital signal processor (DSP), processing circuitry with or without an accompanying DSP, or various other processing devices including integrated circuits such as, for example, an ASIC (application specific integrated circuit), an FPGA (field programmable gate array), a microcontroller unit (MCU), a hardware accelerator, a special-purpose computer chip, or the like. In an example embodiment, the processor 70 may be configured to execute instructions stored in the memory device 76 or otherwise accessible to the processor 70. As such, whether configured by hardware or software methods, or by a combination thereof, the processor 70 may represent an entity (e.g., physically embodied in circuitry) capable of performing operations according to an embodiment of the invention while configured accordingly. Thus, for example, when the processor 70 is embodied as an ASIC, FPGA or the like, the processor 70 may be specifically configured hardware for conducting the operations described herein. Alternatively, as another example, when the processor 70 is embodied as an executor of software instructions, the instructions may specifically configure the processor 70 to perform the algorithms and operations described herein when the instructions are executed. However, in some cases, the processor 70 may be a processor of a specific device (e.g., a mobile terminal or network device) adapted for employing an embodiment of the invention by further configuration of the processor 70 by instructions for performing the algorithms and operations described herein. The processor 70 may include, among other things, a clock, an arithmetic logic unit (ALU) and logic gates configured to support operation of the processor 70.

In an example embodiment, the processor 70 may be configured to operate a connectivity program, such as a browser, Web browser or the like. In this regard, the connectivity program may enable the apparatus 50 to transmit and receive Web content, such as for example location-based content or any other suitable content, according to a Wireless Application Protocol (WAP), for example.

Meanwhile, the communication interface 74 may be any means such as a device or circuitry embodied in either hardware, a computer program product, or a combination of hardware and software that is configured to receive and/or transmit data from/to a network and/or any other device or module in communication with the apparatus 50. In this regard, the communication interface 74 may include, for example, an antenna (or multiple antennas) and supporting hardware and/or software for enabling communications with a wireless communication network (e.g., network 30). In fixed environments, the communication interface 74 may alternatively or also support wired communication. As such, the communication interface 74 may include a communication modem and/or other hardware/software for supporting communication via cable, digital subscriber line (DSL), universal serial bus (USB), Ethernet or other mechanisms.

The user interface 67 may be in communication with the processor 70 to receive an indication of a user input at the user interface 67 and/or to provide an audible, visual, mechanical or other output to the user. As such, the user interface 67 may include, for example, a keyboard, a mouse, a joystick, a display, a touch screen, a microphone, a speaker, or other input/output mechanisms. In an example embodiment in which the apparatus is embodied as a server or some other network devices, the user interface 67 may be limited, remotely located, or eliminated. The processor 70 may comprise user interface circuitry configured to control at least some functions of one or more elements of the user interface, such as, for example, a speaker, ringer, microphone, display, and/or the like. The processor 70 and/or user interface circuitry comprising the processor 70 may be configured to control one or more functions of one or more elements of the user interface through computer program instructions (e.g., software and/or firmware) stored on a memory accessible to the processor 70 (e.g., memory device 76, and/or the like).

In an example embodiment, the processor 70 may be embodied as, include or otherwise control a 3D geographic model (GM) module 78 (also referred to herein as 3D GM module 78). As such, in one embodiment, the processor 70 may be said to cause, direct or control the execution or occurrence of the various functions attributed to the 3D GM module 78, as described herein. The 3D GM module 78 may be any means such as a device or circuitry operating in accordance with software or otherwise embodied in hardware or a combination of hardware and software (e.g., processor 70 operating under software control, the processor 70 embodied as an ASIC or FPGA specifically configured to perform the operations described herein, or a combination thereof) thereby configuring the device or circuitry to perform the corresponding functions of the 3D GM module, as described herein. Thus, in examples in which software is employed, a device or circuitry (e.g., the processor 70 in one example) executing the software forms the structure associated with such means.

In an example embodiment, the 3D GM module 78 may generate a 3D geographic model(s) (e.g., a 3D urban (e.g., city) model(s)) based in part on analyzing a cloud(s) of 3D points, as described more fully below. In one example embodiment, the cloud(s) of 3D points may be received from a LIDAR device 75 of an aerial system (e.g., airplane, helicopter, satellite, etc.).

The LIDAR device 75 may include a sensor 71 (e.g., a laser sensor) and a Global Positioning System (GPS) device 73. In this regard, in an instance in which the sensor 71 is pointed at a targeted area on the ground, the sensor 71 may detect a beam of light that is reflected by the targeted surface. As such, the sensor 71 may detect the reflected light to measure a range(s) (e.g., a distance(s) to a surface (e.g., the ground) of the Earth). The GPS device 73 may analyze scan angles and calibration data of the measured range(s) and may combine the measured range(s) with detected position and orientation data generated from GPS device 73 to generate a cloud (e.g., group/set) of points (e.g., elevation points). Each point of the cloud of points may include three-dimensional information about the targeted area detected. In this regard, each point in the point cloud (also referred to herein as a cloud of 3D points) may include three-dimensional (e.g., geo-referenced 3D points) spatial coordinates (e.g., latitude, longitude, and altitude coordinates) that correspond to a particular point corresponding to the reflected light detected by the sensor 71. The 3D points of the point cloud may be received by the 3D GM module 78 and/or the processor 70 and may be stored in the memory device 76.

As an example, for purposes of illustration and not of limitation, a cloud of 3D points detected by a LIDAR device (e.g., LIDAR device 75) from a beam of light reflected by a targeted geographical area (e.g., an urban area (e.g., San Francisco)) may be presented for display, via display 85, as shown in FIG. 3.

In an alternative example embodiment, the 3D GM module 78 may receive a cloud(s) of 3D points from a database (e.g., a USGS database) storing a cloud of 3D points. In another example embodiment, the 3D GM module 78 may create a cloud(s) of 3D points from detected terrain triangular meshes or directly from stereoscopy computational mechanisms. In yet another example embodiment, the 3D GM module 78 may receive a cloud(s) of 3D points detected from ground LIDAR (e.g., collected by vehicles using a LIDAR device (e.g., LIDAR device 75)).

In an example embodiment, the 3D GM module 78 may generate a non-iterative (e.g., deterministic), non-parametric (e.g., non-usage of predefined shapes of a dictionary to fit on collected data) technique that facilitates computing of detailed 3D polygonal models of geographical (e.g., urban) structures from a detected cloud of 3D points (e.g., 3D points detected by LiDAR sensors attached to an aerial system). In this example embodiment, the 3D GM module 78 may determine that some structures in a detected scene(s) of the cloud of 3D points include walls and a rooftop(s).

Referring now to FIGS. 4A, 4B, 4C, 4D, 4E, 4F and 4G, the 3D GM module 78 may analyze a cloud of 3D points, remove walls, segment rooftops, delineate rooftops and downward project the resulting contours of the delineated rooftops to generate a 3D model(s) of a geographic area (e.g., urban (e.g., city) area), as described more fully below.

Referring now to FIG. 4A, a diagram illustrating a detected cloud of 3D points corresponding to a geographical area is provided according to an example embodiment. In the example embodiment of FIG. 4A, the 3D GM module 78 may receive input of a cloud of 3D points detected by a LIDAR device (e.g., LIDAR device 75) in response to the LIDAR device of an aerial system (e.g., an airplane, a helicopter, a satellite) detecting a beam of reflected light from a targeted area (e.g., an urban area (e.g., an area of a city)). In response to analyzing the cloud of 3D points, the 3D GM module 78 may detect one or more structures (e.g., buildings, trees) and terrain of the targeted area (e.g., a geographical area).

Referring now to FIG. 4B, a diagram illustrating wall removal of one or more structures detected in a cloud of 3D points is provided according to an example embodiment. In the example embodiment of FIG. 4B, the 3D GM module 78 may remove the points (e.g., 3D points) lying on vertical structures (e.g., walls 51, 53, 55). The elimination/removal of the walls by the 3D GM module 78 makes rooftops appear to float in the air and allows the rooftops to be subsequently segmented by the 3D GM module 78, as described more fully below. The 3D GM module 78 may remove walls (e.g., walls 51, 53, 55) based in part on computing a maximum projection of the 3D points in the Z direction. In this regard, the 3D GM module 78 may analyze and traverse the 3D points of the cloud and 3D points that lie underneath a higher 3D point may be removed by the 3D GM module 78, as shown in FIG. 4B. The result may include a new cloud of points without vertical structures, as shown in FIG. 4B and described more fully below. In an alternative example embodiment, different methodologies may be applied in order to remove walls without subsequent changes in a pipeline. For example, the 3D GM module 78 may compute the normal vector for every 3D point (e.g., based on each 3D point and its vicinity (e.g., by computing a covariance matrix at each point)) and remove those points with a predefined deviation from a vertical vector (e.g., (0,0,1)).

Referring now to FIG. 4C, a diagram illustrating wall removal is provided according to an example embodiment. In particular, FIG. 4C illustrates a two dimensional (2D) (x, z) depiction of wall removal corresponding to FIG. 4B. The graph 22 depicts structures having walls and rooftops that are detected in the cloud of points. In the example embodiment of FIG. 4C, the 3D GM module 78 determines the maximum projection in the Z plane and identifies points with maximum height within a predefined vicinity (e.g., the group of points 31, 33, 35, 37, 39, 41 and 43 of the graph 24) and removes redundant points in that direction (e.g., the group of points 30, 32, 34, 36, 38 and 40 in graph 24). In other words, the group of points 30, 32, 34, 36, 38 and 40 (e.g., corresponding to walls) that lie below or underneath a higher point(s) (e.g., group of points 31, 33, 35, 37, 39, 41, and 43 (e.g., corresponding to rooftops)) is removed by the 3D GM module 78. The result is a new cloud of 3D points without vertical structures in the graph 26.

Referring now to FIG. 4D, a diagram illustrating rooftop segmentation is provided according to an example embodiment. In the example embodiment of FIG. 4D, the 3D GM module 78 may segment rooftops (e.g., rooftops 57, 59, and 61) of structures (e.g., buildings) from one another and the ground 63 may be detected by the 3D GM module 78 as being the largest segmented area in the analyzed cloud of 3D points. The 3D GM module 78 may analyze or traverse the 3D points of the cloud and group or cluster 3D points that touch (also referred to herein as touching points) together. Due to the non-grid nature of the points, the 3D GM module 78 may determine that points touch in an instance in which a spatial distance between two points (e.g., two adjacent points) is equal to or less than a predetermined threshold (e.g., 2 meters, 50 centimeters, etc.). As such, the computational complexity of an algorithm implemented by the 3D GM module 78 for determining a 3D geographical model corresponding to a 3D cloud of points is denoted by $O(n \times k)$, where "n" is the number of points in the cloud and "k" is the average number of points within a vicinity or neighborhood defined by the predefined threshold and "O" denotes computational complexity.

The 3D GM module 78 may traverse or analyze the cloud of 3D points (e.g., a first cloud traversal) to define or assign respective labels for points that touch together to denote that 3D points are clustered or grouped together. In one example embodiment, the defined/assigned labels may be visible indicia (e.g., different colors) associated with the clustered points. In another example embodiment, the defined/assigned labels may be values (e.g., integers) assigned or associated with the clustered points.

In an example embodiment, the 3D GM module 78 may traverse (e.g., analyze) the cloud of 3D points a second time to remove redundancies or errors in the labeling process of a first cloud traversal (analysis) of the 3D points. In this regard, points in a same rooftop (correspond to a cluster of touching points) receiving different labels may be removed. In one example embodiment, the first cloud traversal of the rooftop segmentation may occur at the same time in which the 3D GM module 78 performs wall removal. In another alternative example embodiment, the first and second cloud traversals of the rooftop segmentation may occur subsequent to the wall removal.

Referring now to FIG. 4E, a diagram illustrating a parenthood tree is provided according to an example embodiment. Since rooftops may have architectural details and parts there were separated during wall removal, the 3D GM module 78 may create a parenthood tree that encodes the relationship between rooftop parts, as shown in FIG. 4E. The 3D GM module 78 may generate the parenthood tree 11 (e.g., a k-dimensional tree) by traversing a zero-height version of a rooftop segmented cloud, starting from a point on the ground (e.g., ground 63) (for example, the ground was detected as being the largest segmented region), and analyzing each point(s) as well as corresponding points in each of the analyzed points vicinity with different segmentation labels. In this regard, the 3D GM module 78 may generate a zero-height version of a cloud that is a flat cloud of points in which each point has an assigned label created after rooftop segmentation.

In the example embodiment of FIG. 4E points may receive different segmentation labels because of their distance in space (e.g., height). In the flattened version of the cloud, generated by the 3D GM module 78, points may be adjacent in the Z=0 plane. In this regard, the 3D GM module 78 may infer vicinity from points that are separated in the Z-plane. Starting from a node that encodes the ground (e.g., ground 63), the 3D GM module 78 may add new nodes for each rooftop that has points touching one of the ground points. Subsequently, the 3D GM module 78 may add nodes under a rooftop node in the parenthood tree 11 for each rooftop part (that is not already in the parenthood tree 11) with touching points. Once all points in the cloud are traversed/analyzed, by the 3D GM module 78, the parenthood tree 11 is complete and a full relational representation of the scene corresponding to the points of the cloud is created by the 3D GM module 78.

In an example embodiment, the 3D GM module 78 may generate the parenthood tree 11 of FIG. 4E in the following manner. The cloud of 3D points associated with the ground (also referred to herein as ground cloud) is traversed first and is assigned a node label "0" by the 3D GM module 78. Subsequently, the 3D GM module 78 may determine that rooftops "1" and "2" have touching points to the ground cloud and are added under node "0". Thereafter, the 3D GM module 78 analyzes and traverses cloud "1" and may determine that rooftops "3" and "4" touch. As such, rooftops "3" and "4" are added, by the 3D GM module 78, under node "1". The 3D GM module 78 may then analyze and traverse cloud "2" and detect touching rooftop "5", which may be added under node "2" by the 3D GM module 78. Thereafter, the 3D GM module 78 may analyze and traverse cloud "3" and detect touching rooftop "6", which may be added under node "3" by the 3D GM module 78. Subsequently, the 3D GM module 78 may analyze and traverse clouds "4", "5" and "6" and may determine that there are no touching rooftops, corresponding to clouds "4", "5" and "6", that are not already detected and included in the parenthood tree 11. In this manner, the parenthood tree 11 is completed by the 3D GM module 78.

Referring now to FIG. 4F, a diagram illustrating rooftop delineation is provided according to an example embodiment. Once rooftops (e.g., rooftops 60, 62 and 64) are segmented from one another and the parenthood relationship between rooftops is determined by the 3D GM module 78, the 3D GM module 78 may implement a concave hull algorithm that extracts the outer boundary of each rooftop and corresponding parts (e.g., an inner portion of each rooftop). In response to extracting the outer boundary of each rooftop and corresponding parts the 3D GM module 78 may determine an indication (e.g., a list, a group) of 3D points that delineates (also referred to herein as outlines) each rooftop (e.g., rooftops 60, 62 and 64), as shown in FIG. 4F.

Referring now to FIG. 4G, a diagram illustrating downward projection is provided according to an example embodiment. In the example embodiment of FIG. 4G, the 3D GM module 78 may analyze and traverse an indication (e.g., a list, a group) of rooftop delineating 3D points (e.g., the 3D points that delineates or outlines each rooftop as shown in FIG. 4F) and may determine base height of the rooftop delineations of 3D points by determining the height of the closest point in a closest or nearest delineated rooftop below the delineating rooftop being examined.

In one example embodiment, the 3D GM module 78 may determine a height of delineating points of a rooftop (e.g., rooftop "4" of parenthood tree 11) being examined relative to a height of a closest point of a closest parental rooftop (e.g., rooftop "1" of parenthood tree 11) identified in a parenthood tree (e.g., parenthood tree 11)). Additionally, the 3D GM module 78 may determine a height of delineating points of a rooftop (e.g., rooftop "1" of parenthood tree 11) being examined based in part on detecting a height of the ground (e.g., ground cloud "0" of parenthood tree 11) in an instance in which there is no closest delineated rooftop below the delineated points of the rooftop being examined.

In this regard, the 3D GM module 78 may create the 3D models (e.g., 3D geographic models) of FIG. 4G by encoding and connecting the outline or delineating points of rooftops at their base elevations (e.g., footprints) plus a height determined, by the 3D GM module 78, from the difference between the base and original height(s) of each delineating 3D point(s) being examined.

By connecting the delineating points at their base to a height(s) of each delineating point(s), the 3D GM module 78 may generate 3D structures (e.g., buildings, etc.) and terrain corresponding to the cloud of 3D points in 3D models (e.g., 3D urban models) in a fast and efficient manner.

It should be pointed out that although rooftops and walls are described as examples of some of the structures (e.g., buildings) corresponding to 3D points of a cloud(s), other features (e.g., trees, vegetation) may also be detected in 3D points of a cloud(s). Additionally, in an alternative example embodiment structures such as for example, rooftops and trees may be analyzed, by the 3D GM module 78, according to the distribution of points in a 3D space or the distribution of the variance of their normal vectors. In this regard, trees, for example, may present a higher heterogeneity than man-made rooftops.

Referring now to FIG. 5, a diagram illustrating wall removal is provided according to an example embodiment. In this regard, FIG. 5 shows results of a wall removal of structures for a geographic area such as, for example, an urban area (e.g., a city). For instance, in the example embodiment of FIG. 5, the 3D GM module 78 analyzed the cloud of 3D points representing the geographic area (e.g., an urban area) and removed each of the vertical structures (e.g., walls) detected.

Referring now to FIG. 6, a diagram illustrating rooftop segmentation is provided according to an example embodiment. In this regard, FIG. 6 shows results of rooftop segmentation for a geographic area such as, for example, an urban area (e.g., a city). In the example embodiment of FIG. 6, the 3D GM module 78 may analyze a cloud of 3D points corresponding to the geographic area and assign a label such as, for example, visible indicia (e.g., a color(s)) or a value (e.g., an integer) to 3D points on a same rooftop. On the other hand, the 3D GM module 78 may assign different labels such as, for example, different items of visible indicia (e.g., different colors) or different values (e.g., different integers) to 3D points in different rooftops.

Referring now to FIG. 7, a diagram illustrating rooftop delineation is provided according to an example embodiment. In this regard, FIG. 7 shows results of rooftop delineation for a geographic area such as, for example, an urban area (e.g., a city). In the example embodiment of FIG. 7, the 3D GM module 78 may extract the outer boundary of each rooftop and their corresponding parts to delineate or outline each rooftop. The labels assigned to the rooftops segmented in FIG. 6 remain or are kept for consistency, by the 3D GM module 78, in the delineation or outline of each of the rooftops in FIG. 7.

Referring now to FIG. 8, a diagram illustrating a map is provided according to an example embodiment. In the example embodiment of FIG. 8, the 3D GM module 78 may perform a downward projection and generate 3D models (e.g., 3D urban models) by encoding and connecting the delineated 3D points of rooftops to a base. In this regard, for example, the 3D GM module 78 may connect 3D points of a delineated rooftop being examined to a closest delineated rooftop below the delineated rooftop being examined. Alternatively, the 3D GM module 78 may connect the 3D points of the delineated rooftop being examined to the ground in an instance in which there is no closest delineated rooftop below the delineated rooftop being examined. As such, the 3D GM module 78 may provide or project the generated 3D models onto a corresponding map 3. In this regard, the cloud of 3D points corresponding to the 3D models are projected on and included in the map 3. The 3D GM module 78 may present the map 5 for showing via a display (e.g., display 85).

Referring now to FIG. 9, a diagram of another map is provided according to an example embodiment. In the example embodiment of FIG. 9, the 3D GM module 78 may provide or project a closer view of the generated 3D models on a map 5 illustrating the architectural details of Pier 1 in a geographical area such as, for example, San Francisco, Calif. The 3D GM module 78 may present the map 5 for showing via a display (e.g., display 85).

Referring now to FIG. 10, a diagram of another map is provided according to an example embodiment. In the example embodiment of FIG. 10, the 3D GM module 78 may provide or project a closer view of the generated 3D models on a map 8 illustrating the architectural details of a financial district in a geographical area such as, for example, San Francisco, Calif. The 3D GM module 78 may present the map 8 for showing via a display (e.g., display 85).

Referring now to FIG. 11, a diagram of another map is provided according to an example embodiment. In the example embodiment of FIG. 11, the 3D GM module 78 may provide or project an overall view of the generated 3D models on a map 9 illustrating a geographical area such as, for example, San Francisco, Calif.

Referring now to FIG. 12, an example embodiment of a flowchart for generating 3D geographical models is provided according to an example embodiment. At operation 1200, an apparatus 50 may include means, such as the 3D GM module 78, the processor 70 and/or the like, for removing one or more 3D points of a cloud depicting vertical structures (e.g., walls (e.g., walls 51, 53, 55)) detected in a geographic area (e.g., an urban area (e.g., a city)) in response to analyzing a set of 3D points of the cloud corresponding to the geographic area. Each of the points may include data indicating geocoordinates (e.g., latitude, longitude and altitude coordinates) of the geographic area. At operation 1205, the apparatus 50 may include means, such as the 3D GM module 78, the processor 70 and/or the like, for segmenting rooftops (e.g., rooftops 57, 59, 61) of the vertical structures detected in the geographic area, in response to analyzing the set of 3D points. The 3D GM module 78 may segment the rooftops by separating each of the rooftops from another respective rooftop (e.g., separating the rooftops from each other).

At operation 1210, the apparatus 50 may include means, such as the 3D GM module 78, the processor 70 and/or the like, for delineating (e.g., outlining) the points of the segmented rooftops in response to extracting an outer boundary and at least a subset of an inner portion of the segmented rooftops. At operation 1215, the apparatus 50 may include means, such as the 3D GM module 78, the processor 70 and/or the like, for generating one or more 3D geographic models depicting the geographic area in 3D based in part on connecting each of the delineating points of the segmented rooftops to a corresponding base comprising a height that is lower than respective heights of the delineating points.

It should be pointed out that FIG. 12 is a flowchart of a system, method and computer program product according to an example embodiment of the invention. It will be understood that each block of the flowchart, and combinations of blocks in the flowchart, can be implemented by various means, such as hardware, firmware, and/or a computer program product including one or more computer program instructions. For example, one or more of the procedures described above may be embodied by computer program instructions. In this regard, in an example embodiment, the computer program instructions which embody the procedures described above are stored by a memory device (e.g., memory device 76) and executed by a processor (e.g., processor 70, 3D GM module 78). As will be appreciated, any such computer program instructions may be loaded onto a computer or other programmable apparatus (e.g., hardware) to produce a machine, such that the instructions which execute on the computer or other programmable apparatus cause the functions specified in the flowchart blocks to be implemented. In one embodiment, the computer program instructions are stored in a computer-readable memory that can direct a computer or other programmable apparatus to function in a particular manner, such that the instructions stored in the computer-readable memory produce an article of manufacture including instructions which implement the function specified in the flowchart blocks. The computer program instructions may also be loaded onto a computer or other programmable apparatus to cause a series of operations to be performed on the computer or other programmable apparatus to produce a computer-implemented process such that the instructions which execute on the computer or other programmable apparatus implement the functions specified in the flowchart blocks.

Accordingly, blocks of the flowchart support combinations of means for performing the specified functions. It will also be understood that one or more blocks of the flowchart, and combinations of blocks in the flowchart, can be implemented by special purpose hardware-based computer systems which perform the specified functions, or combinations of special purpose hardware and computer instructions.

In an example embodiment, an apparatus for performing the method of FIG. 12 above may comprise a processor (e.g., the processor 70, the 3D GM module 78) configured to perform some or each of the operations (1200-1215) described above. The processor may, for example, be configured to perform the operations (1200-1215) by performing hardware implemented logical functions, executing stored instructions, or executing algorithms for performing each of the operations. Alternatively, the apparatus may comprise means for performing each of the operations described above. In this regard, according to an example embodiment, examples of means for performing operations (1200-1215) may comprise, for example, the processor 70 (e.g., as means for performing any of the operations described above), the 3D GM module 78 and/or a device or circuit for executing instructions or executing an algorithm for processing information as described above.

Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific embodiments disclosed and that modifications and other embodiments are intended to be included within the scope of the appended claims. Moreover, although the foregoing descriptions and the associated drawings describe exemplary embodiments in the context of certain exemplary combinations of elements and/or functions, it should be appreciated that different combinations of elements and/or functions may be provided by alternative embodiments without departing from the scope of the appended claims. In this regard, for example, different combinations of elements and/or functions than those explicitly described above are also contemplated as may be set forth in some of the appended claims. Although specific terms are employed herein, they are used in a generic and descriptive sense only and not for purposes of limitation.

That which is claimed:

1. A method comprising:
analyzing a set of three dimensional points of a cloud depicting structures detected in a geographic area in which each of the points comprises data indicating geocoordinates of the geographic area to identify touching points;
assigning labels to the points of the cloud based on the identified touching points;
generating a two-dimensional version of the cloud;
determining relationships between roof segments defined by the assigned labels based on the position of points assigned labels corresponding to the roof segments within the two-dimensional version of the cloud;
extracting an outer boundary of each of the roof segments; and
generating one or more three dimensional geographic models depicting the geographic area in three dimensions based in part on connecting a boundary for each roof segment to a corresponding base based at least in part on the determined relationships.

2. The method of claim 1, further comprising analyzing the set of three dimensional points of the cloud a second time to remove at least one of redundancies or errors in the assigned labels.

3. The method of claim 1, wherein a relationship between a first roof segment and a second roof segment is determined based on at least one point assigned a label corresponding to the first roof segment being in the vicinity of at least one point assigned a label corresponding to the second roof segment.

4. The method of claim 1, wherein the outer boundary of at least one roof segment is determined using a concave hull algorithm.

5. The method of claim 1, further comprising before or during the analysis of the set of three dimensional points of the cloud, removing one or more three dimensional points depicting vertical structures from the cloud.

6. The method of claim 1, wherein connecting a boundary of a roof segment to a corresponding base comprises downwardly projecting the boundary of the roof segment to the corresponding base.

7. The method of claim 1, further comprising projecting the geographic models onto a map associated with the geographic area.

8. An apparatus comprising at least one processor, and at least one memory storing computer program code, with the at least one memory and the computer program code configured to, with the processor, cause the apparatus to at least:
analyze a set of three dimensional points of a cloud depicting structures detected in a geographic area in which each of the points comprises data indicating geocoordinates of the geographic area to identify touching points;

assign labels to the points of the cloud based on the identified touching points;

generate a two-dimensional version of the cloud;

determine relationships between roof segments defined by the assigned labels based on the position of points assigned labels corresponding to the roof segments within the two-dimensional version of the cloud;

extract an outer boundary of each of the roof segments; and generate one or more three dimensional geographic models depicting the geographic area in three dimensions based in part on connecting a boundary for each roof segment to a corresponding base based at least in part on the determined relationships.

9. The apparatus of claim 8, wherein the at least one memory and the computer program code are further configured to, with the processor, cause the apparatus to at least analyze the set of three dimensional points of the cloud a second time to remove at least one of redundancies or errors in the assigned labels.

10. The apparatus of claim 8, wherein a relationship between a first roof segment and a second roof segment is determined based on at least one point assigned a label corresponding to the first roof segment being in the vicinity of at least one point assigned a label corresponding to the second roof segment.

11. The apparatus of claim 8, wherein the outer boundary of at least one roof segment is determined using a concave hull algorithm.

12. The apparatus of claim 8, wherein the at least one memory and the computer program code are further configured to, with the processor, cause the apparatus to at least, before or during the analysis of the set of three dimensional points of the cloud, remove one or more three dimensional points depicting vertical structures from the cloud.

13. The apparatus of claim 8, wherein connecting a boundary of a roof segment to a corresponding base comprises downwardly projecting the boundary of the roof segment to the corresponding base.

14. The apparatus of claim 8, wherein the at least one memory and the computer program code are further configured to, with the processor, cause the apparatus to at least project the geographic models onto a map associated with the geographic area.

15. A computer program product comprising at least one non-transitory computer-readable storage medium having computer-executable program code instructions stored therein with the computer-executable program code instructions comprising program code instructions configured to:

analyze a set of three dimensional points of a cloud depicting structures detected in a geographic area in which each of the points comprises data indicating geocoordinates of the geographic area to identify touching points;

assign labels to the points of the cloud based on the identified touching points;

generate a two-dimensional version of the cloud;

determine relationships between roof segments defined by the assigned labels based on the position of points assigned labels corresponding to the roof segments within the two-dimensional version of the cloud;

extract an outer boundary of each of the roof segments; and generate one or more three dimensional geographic models depicting the geographic area in three dimensions based in part on connecting a boundary for each roof segment to a corresponding base based at least in part on the determined relationships.

16. The computer program product of claim 15, wherein a relationship between a first roof segment and a second roof segment is determined based on at least one point assigned a label corresponding to the first roof segment being in the vicinity of at least one point assigned a label corresponding to the second roof segment.

17. The computer program product of claim 15, wherein the outer boundary of at least one roof segment is determined using a concave hull algorithm.

18. The computer program product of claim 15, wherein the computer-executable program code instructions further comprise program code instructions configured to, before or during the analysis of the set of three dimensional points of the cloud, remove one or more three dimensional points depicting vertical structures from the cloud.

19. The computer program product of claim 15, wherein connecting a boundary of a roof segment to a corresponding base comprises downwardly projecting the boundary of the roof segment to the corresponding base.

20. The computer program product of claim 15, wherein the computer-executable program code instructions further comprise program code instructions configured to project the geographic models onto a map associated with the geographic area.

* * * * *